United States Patent [19]

Yoo et al.

[11] Patent Number: 5,369,292
[45] Date of Patent: Nov. 29, 1994

[54] AVALANCHE PHOTODIODE HAVING A MULTIPLICATION LAYER WITH SUPERLATTICE

[75] Inventors: Ji-Beom Yoo; Chan-Yong Park; Hong-Man Kim, all of Daejeon, Rep. of Korea

[73] Assignees: Electronics and Telecommunications Research Institute; Korea Telecommunication Authority, Rep. of Korea

[21] Appl. No.: 149,775

[22] Filed: Nov. 10, 1993

[30] Foreign Application Priority Data

Dec. 22, 1992 [KR] Rep. of Korea ............... 1992-25002

[51] Int. Cl.⁵ .................................................... H01L 31/06
[52] U.S. Cl. ................................... 257/186; 257/190; 257/18; 257/21
[58] Field of Search ................... 257/18, 21, 186, 190

[56] References Cited

U.S. PATENT DOCUMENTS 5,308,995  5/1994  Tsuji et al. ........................... 257/18

FOREIGN PATENT DOCUMENTS 0506127  9/1992  European Pat. Off. ............ 257/21
2119274  5/1990  Japan .................................... 257/21
3-66179  3/1991  Japan .................................... 257/21
4-61174  2/1992  Japan .................................. 257/186

*Primary Examiner*—Jerome Jackson
*Attorney, Agent, or Firm*—Larson and Taylor

[57] ABSTRACT

An avalanche photodiode in which a strained superlattice structure is used as a multiplication layer, comprising: an $n^+$ type InP substrate; an $n^+$ type InP epitaxial layer formed on a main surface of the substrate; an N type $In_{1-x}Al_xAs$ layer formed on the epitaxial layer; an $n^+$ type $In_{1-x}Al_xAs$ layer formed on the N type $In_{1-x}Al_xAs$ layer, the $n^+$ type $In_{1-x}Al_xAs$ layer having a relatively high impurity concentration more than the N type $In_{1-x}Al_xAs$ layer; the multiplication layer deposited on the $n^+$ type $In_{1-x}Al_xAs$ layer, the multiplication layer having an $In_{0.53}Ga_{0.47}As/In_{1-x}Al_xAs$ superlattice structure; first and second $p^+$ type $In_{1-x}Al_xAs$ layers laminated sequentially on the multiplication layer; an absorbing layer formed on the second $p^+$ type $In_{1-x}Al_xAs$ layer, the absorbing layer being made of an $In_{0.53}Ga_{0.47}As$; a P type InP layer formed on the absorbing layer to reduce a surface leakage current; an $In_{0.53}Ga_{0.47}As$ layer formed on the P type InP layer to be provided for an ohmic contact, and metal layers formed on an upper surface of the $In_{0.53}Ga_{0.47}As$ layer and the other surface of the substrate, respectively.

3 Claims, 2 Drawing Sheets

AVALANCHE PHOTODIODE HAVING A MULTIPLICATION LAYER WITH SUPERLATTICE

BACKGROUND OF THE INVENTION

1. Field of the Invention

The present invention relates to a construction of an avalanche photodiode in which a strained superlattice structure is used as a multiplication layer thereof.

2. Description of the Prior Art

Generally, various types of avalanche photodiodes have been widely used in the art as light receiving elements for an optical fiber communication system. Each of such avalanche photodiodes are relatively advantageous in sensitivity, as compared with a PIN photodiode. In recent years, photodiodes are further used in the optical communication system, particularly the optical system required for high speed operation of several Gbps or more.

Such an avalanche photodiode is largely composed of two main layers in construction, an absorbing layer and a multiplication layer. Particularly, the absorbing layer receives an optical signal to produce a plurality of pairs of electron and hole by photo-excitation due to the introduced optical signal therein.

For example, each of the pairs of the electron and the hole thus produced is separated into electron and hole by an internal electric field, one of which is introduced into the multiplication layer as a carrier. The introduced carrier collides with electrons in the valence band thereof, thereby obtaining accelerating energy from the high electric field applied to the multiplication layer, and thus a plurality of pairs of electron and hole are generated newly by the collision. As a result, the avalanche photodiode can obtain a desired inner gain.

As mentioned above, to obtain inner gains from the multiplication layer of such an avalanche photodiode, high voltage needs to be applied to the photodiode so as to increase intensity of the electric field applied to the multiplication layer, and then avalanche multiplication for obtaining the inner gain and tunneling phenomenon occur in large numbers in the case that the multiplication layer is made of material having a small band gap.

Since the tunneling phenomenon occurs in accordance with intensity of applied electric field without reference to the introduced optical signal, multiplication noise in the avalanche photodiode is increased largely and thus operating characteristic thereof is lowered badly due to increase of the noise.

In order to use such an avalanche photodiode in any optical communication system, since the photodiode has to be capable of absorbing wavelength of 1.3 to 1.55 millimeter as wavelength being available in the optical communication system, an $In_{0.53}Ga_{0.47}As$ having a small band gap (for example, 0.76 eV) has to be provided for the absorbing layer and the multiplication layer. Such an avalanche photodiode has a serious problems in that tunneling phenomenon occurs.

Conventionally, to overcome the above-mentioned problem, it is proposed an SAM (sequential absorption and multiplication) structure that a multiplication occurs in an InP multiplication layer having a larger band gap than $In_{0.53}Ga_{0.47}As$. In the avalanche photodiode provided with this SAM structure, since the multiplication is caused in the InP multiplication layer having a large band gap, a tunneling phenomenon is reduced and therefore noise is reduced and sensitivity is increased.

However, remaining noise due to the multiplication is increased to thereby badly lower sensitivity of properties of the photodiode, because electron and hole have similar ionization coefficient by property of the InP material.

In recent years, efforts have been given to lowering of the native ionization coefficient ratio of each material, and reduction of redundant noise caused by multiplication therein continuously, a typical effort thereof is that an InGaAs(P)/InAlAs superlattice lattice-matched with InP is used as a multiplication layer for the avalanche photodiode. Since the InGaAs(P)/InAlAs superlattice has large conduction band discontinuity, and small valence band discontinuity, electrons in the multiplication layer receive energy caused by the conduction band discontinuity in addition to energy caused by the electric field to thereby enhance ionization coefficient ratio.

FIG. 1 shows construction of a conventional avalanche photodiode using as an InAlAs/InGaAs(P) superlattice structure as a multiplication layer. In FIG. 1, reference numeral 1 represents an $n^+$ type InP substrate, 2 represents a buffer layer which is made of an InP epitaxial layer on a main surface of the substrate 1, and 3 represents an $n^+$ type $In_{0.52}Al_{0.48}As$ layer which is lattice-matched with InP of the buffer layer 2 and is doped with a high concentration of an N type impurity so as to supply a high electric field for a multiplication layer to be mentioned below. In the present embodiment, the InP epitaxial layer 2 is doped with an N type impurity concentration of $1 \times 10^{18} cm^{-3}$ and has 2 $\mu m$ in thickness.

Also, 4 represents the multiplication layer for generating a plurality of electrons and holes. In details, holes in the multiplication layer 4 are excited by an optical signal 9 from an absorbing layer, and then the electrons and the holes are generated by an impact ionization owing to the holes thus photo-excited. Then, in case that the multiplication layer 4 is made of an $In_{0.53}Ga_{0.47}As/In_{0.52}Al_{0.48}As$ superlattice, characteristics of such an avalanche photodiode are lowered due to increase in a dark current due to a tunneling phenomenon in $In_{0.53}Ga_{0.47}As$ layer, because the band gap of the $In_{0.53}Ga_{0.47}As$ is small. On the other hand, it is also proposed that a multiplication layer has an InGaAsP having approximately 1.0 ev band gap in place of the $In_{0.53}Ga_{0.47}As$ of small band gap, as a superlattice structure.

In addition, on the multiplication layer 4 is formed a $p^+$ type InP layer 5 which is doped with a high impurity concentration so as to prevent the tunneling phenomenon in an absorbing layer, when a high electric field is applied to the multiplication layer 4. The absorbing layer 6 is formed on the $p^+$ type InP layer 5 and is made of an $In_{0.53}Ga_{0.47}As$ having a small band gap, so as to generate a plurality of electrons and holes due to a photo-excitation caused by the optical signal. On one surface of the absorbing layer 6 is formed a metal layer 7 having a determined pattern for an ohmic contact of a P type, and on the other surface of the substrate 1 is formed a metal layer 8 for an ohmic contact of an n type.

As shown in the conventional avalanche photodiode, in the case that the photodiode is manufactured using the multiplication layer 4 with an InGaAsP/$In_{0.52}Al_{0.48}As$ superlattice, a well-known MBE (molecular beam epitaxy) process can not be utilized in adjusting thickness thereof and doping concentration of an impurity, since it is necessary to grow the compound semiconductor containing arsenic (As) and phosphorus (P) when growing the InGaAs(P) and the $In_{0.52}Al_{0.48}As$ superlattice.

However, such a superlattice structure may be manufactured using the gas source MBE process or CBE (chemical beam epitaxy) process, as developed recently, but it is largely restricted in use of semiconductor manufacturing equipments utilizing the processes. Also, InGaAsP and $In_{0.52}Al_{0.48}As$ materials must be grown thereon, alternately, so as to form an extremely thin film. For example, $PH_3$ and $AsH_3$ using as the gas sources of phosphorus and arsenic must be introduced very quickly in epitaxial growth of superlattice, alternately. If rapid alternation of such gas sources is required, interface characteristics between the InGaAsP and the $In_{0.52}Al_{0.48}As$ is lowered due to the gas sources remained in the manufacturing equipment, and thus performance of the thus manufactured semiconductor device is expected to be also lowered.

SUMMARY OF THE INVENTION

It is the object of the present invention to provide an avalanche photodiode in which an InAlAs/InGaAs superlattice structure is used as a multiplication layer in order to overcome the above-mentioned problems.

To achieve the object, an avalanche photodiode according to an aspect of the present invention comprising: an n+ type InP substrate; an n+ type InP epitaxial layer formed on a main surface of the substrate; an N type $In_{1-x}Al_xAs$ layer formed on the epitaxial layer; an n+ type $In_{1-x}Al_xAs$ layer formed on the N type $In_{1-x}Al_xAs$ layer, the n+ type $In_{1-x}Al_xAs$ layer having a relatively high impurity concentration more than the N type $In_{1-x}Al_xAs$ layer; a multiplication layer deposited on the n+ type $In_{1-x}Al_xAs$ layer, the multiplication layer having an $In_{0.53}Ga_{0.47}As/In_{1-x}Al_xAs$ superlattice structure; first and second p+ type $In_{1-x}Al_xAs$ layers laminated sequentially on the multiplication layer; an absorbing layer formed on the second p+ type $In_{1-x}Al_xAs$ layer, the absorbing layer being made of an $In_{0.53}Ga_{0.47}As$; a P type InP layer formed on the absorbing layer to reduce a surface leakage current; an $In_{0.53}Ga_{0.47}As$ layer formed on the P type InP layer to be provided for an ohmic contact, and metal layers formed on an upper surface of the $In_{0.53}Ga_{0.47}As$ layer and the other surface of the substrate, respectively.

In one embodiment, the epitaxial layer has about 1 to 3 μm in thickness and is doped with an impurity concentration of approximately $1 \times 10^{18}$ cm$^{-3}$.

In another embodiment, the first P type $In_{1-x}Al_xAs$ layer has about 300 to 400 Angstroms and is doped with an impurity concentration of approximately $1 \times 10^{18}$ cm$^{-3}$.

BRIEF DESCRIPTION OF THE DRAWINGS

This invention may be better understood and its object and advantage will become apparent to those skilled in the art by reference to the accompanying drawings as follows.

DESCRIPTION OF THE PREFERRED EMBODIMENTS

Figure 1:
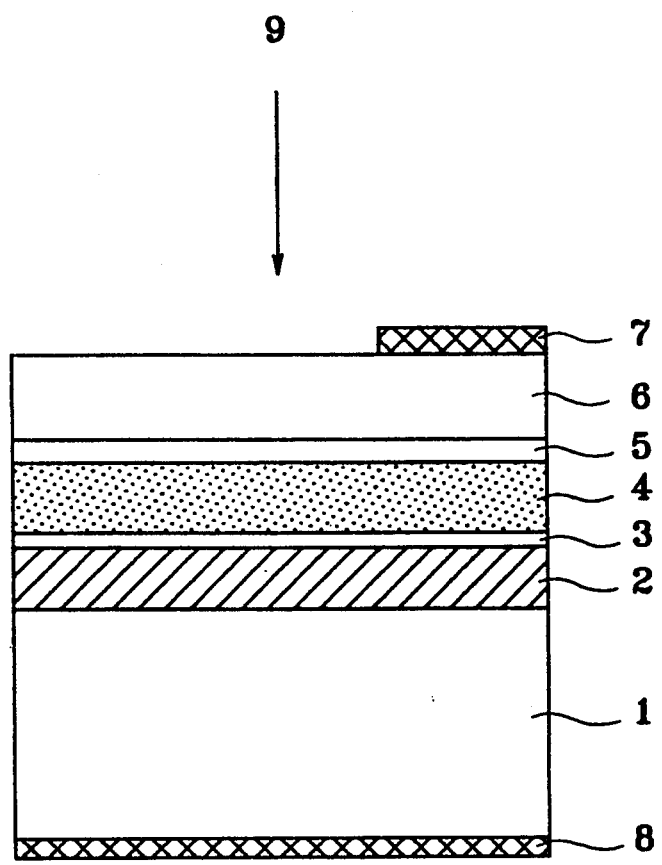
FIG.1 is a cross-sectional view showing construction of a conventional avalanche photodiode using a multiplication layer as an InAlAs/InGaAs(P) superlattice structure.
Figure 2:
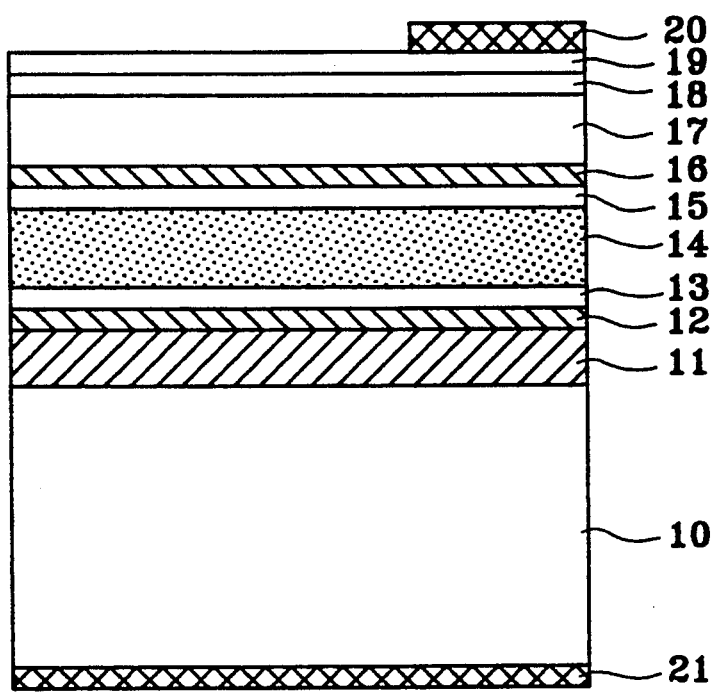
FIG.2 is a cross-sectional view showing construction of the avalanche photodiode according to the present invention.

Referring to FIG. 2, reference numeral 10 is an n+ type InP substrate, other layers are laminated on the substrate 10 in turn. On a main surface of the substrate 10 is formed a buffer layer 11 which is made of an n+ type InP epitaxial layer having thickness of 1 to 3 μm. Also, on the buffer layer 11 is formed an N type $In_{1-x}Al_xAs$ layer 12 which is made within the range of composition of from an N type $In_{0.52}Al_{0.48}As$ to an $In_{1-x}Al_xAs$ to be used in an $In_{0.53}Ga_{0.47}As/In_{1-x}Al_xAs$ superlattice, where x is larger than 0.48.

In FIG.2, on the N type $In_{1-x}Al_xAs$ layer 12 is formed an n+ type $In_{1-x}Al_xAs$ layer 13 which is doped with an impurity concentration of approximately $1 \times 10^{18}$ cm$^{-3}$ and has about 300 Å in thickness. The layer 13 is doped with a relatively high impurity concentration, as compared with that of the layer 12. On the layer 13 is formed a multiplication layer 14 which is made of an $In_{0.53}Ga_{0.47}As/In_{1-x}Al_xAs$ superlattice structure, and on the multiplication layer 14 is formed a first P type $In_{1-x}Al_xAs$ layer 15 which is doped with an impurity concentration of approximately $1 \times 10^{18}$ cm$^{-3}$ and has about 300 Å to 400 Å in thickness.

On the first P type layer 15 is formed a second P type $In_{1-x}Al_xAs$ layer 16 which is made within the range of composition of from a P type $In_{1-x}Al_xAs$ to a P type $In_{0.52}Al_{0.48}As$, and on the second layer 16 is formed an absorbing layer 17 which is made of $In_{0.53}Ga_{0.47}As$. Subsequently, a P type InP layer 18 is formed on the absorbing layer 17 so as to minimize amount of a leakage current in a surface thereof, an $In_{0.53}Ga_{0.47}As$ layer 19 is formed on the P type InP layer 18 so as to form an ohmic contact, and metal layers 20 and 21 for ohmic contacts are formed on the layer 19 and the other surface of the substrate 10.

In this embodiment, the multiplication layer 14 is provided with the $In_{0.53}Ga_{0.47}As/In_{1-x}Al_xAs$ superlattice structure, in which a compressive stress is applied to the $In_{0.53}Ga_{0.47}As$ well layer, in place of the $InGaAsP/In_{0.52}Al_{0.48}As$ superlattice embodied in the conventional avalanche photodiode, where x is a value of 0.48 or more.

Therefore, the photodiode of the present invention has various advantages as mentioned below.

According to the present invention, in the case that the strained superlattice structure composed of $In_{0.53}Ga_{0.47}As/In_{1-x}Al_xAs$ layer is provided for the avalanche photodiode, it is not necessary to grow a compound semiconductor containing phosphorus, and thus with the well-known MBE growing method an epitaxial layer having a high quality may be grown accurately in thickness and concentration of an impurity.

Also, the strained superlattice structure improves the uniformity in an interface between the $In_{0.2}Ga_{0.8}As/In_{1-x}Al_xAs$ of hetero junction to thereby enhance performance of the avalanche photodiode.

Furthermore, the $In_{1-x}Al_xAs$ composition may be controlled and adjusted so that a compress stress can be applied to the InGaAs layer as the well layer, so as to bring about a multiplication operation in the strained superlattice structure. As a result, an effective band gap thereof is increased. In accordance with increase in the band gap of the InGaAs well layer the dark current due to the tunneling phenomenon may be reduced and the avalanche photodiode has a relatively large multiplication rate in the operation. Accordingly, the photodiode is capable of largely increasing the inner gain, as compared with the conventional lattice-matched InGaAsP/InAlAs avalanche photodiode. As a result, sensitivity thereof is enhanced.

In addition, in the case that the $In_{0.53}Ga_{0.47}As/In_{1-x}Al_xAs$ superlattice structure is the multiplication layer, composition of the aluminum (Al) therein, which is provided for controlling of the strain caused by a miss-matching of lattice, can be increased from $x=0.48$ of the lattice matching condition. As a result, the electron affinity of the $In_{1-x}Al_xAs$ using as a barrier layer of the superlattice structure is decreased, and discontinuity in the conduction band of the InGaAs/InAlAs are also increased.

Then, because of the increase in discontinuity of the conduction band in the multiplication layer, energy obtained by electrons therein is increased to reduce an effective ion-coefficient ratio. Accordingly, noise due to the multiplication may be reduced and sensitivity can be enhanced.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. An avalanche photodiode in which a strained superlattice structure is used as a multiplication layer, the photodiode comprising:

an n+ type InP substrate;
   an n+ type InP epitaxial layer formed on a main surface of the substrate;
   an N type $In_{1-x}Al_xAs$ layer formed on the epitaxial layer;
   an n+ type $In_{1-x}Al_xAs$ layer formed on the N type $In_{1-x}Al_xAs$ layer, the n+ type $In_{1-x}Al_xAs$ layer having a relatively high impurity concentration more than the N type $In_{1-x}Al_xAs$ layer;
   the multiplication layer deposited on the n+ type $In_{1-x}Al_xAs$ layer, the multiplication layer having an $In_{0.53}Ga_{0.47}As/In_{1-x}Al_xAs$ superlattice structure;
   first and second p+ type $In_{1-x}Al_xAs$ layers laminated sequentially on the multiplication layer;
   an absorbing layer formed on the second p+ type $In_{1-x}Al_xAs$ layer, the absorbing layer being made of an $In_{0.53}Ga_{0.47}As$;
   a P type InP layer formed on the absorbing layer to reduce a surface leakage current;
   an $In_{0.53}Ga_{0.47}As$ layer formed on the P type InP layer to be provided for an ohmic contact, and
   metal layers formed on an upper surface of the $In_{0.53}Ga_{0.47}As$ layer and the other surface of the substrate, respectively.

2. The avalanche photodiode according to claim 1, wherein the epitaxial layer has about 1 to 3 μm in thickness and is doped with an impurity concentration of approximately $1 \times 10^{18}$ cm$^{-3}$.

3. The avalanche photodiode according to claim 1, wherein the first P type $In_{1-x}Al_xAs$ layer has about 300 to 400 Angstroms and is doped with an impurity concentration of approximately $1 \times 10^{18}$ cm$^{-3}$.

* * * * *